United States Patent [19]

Bouadma et al.

[11] Patent Number: 4,547,956
[45] Date of Patent: Oct. 22, 1985

[54] PROCESS FOR PRODUCING A SEMICONDUCTOR LASER WITH SEVERAL INDEPENDENT WAVELENGTHS AND LASER OBTAINED BY THIS PROCESS

[76] Inventors: Noureddine Bouadma, 45 A, Blvd. Jourdan, 75014 Paris; Jean-Claude Bouley, 35 Avenue du Dr. Durand, 94110 Arcueil; Jean Riou, 25, Avenue de la division Leclerc, 94230 Cachan, all of France

[21] Appl. No.: 479,579

[22] Filed: Mar. 28, 1983

[30] Foreign Application Priority Data

Apr. 8, 1982 [FR] France ............................. 82 06179

[51] Int. Cl.$^4$ ............................................. H01S 3/19
[52] U.S. Cl. ............................. 29/569 L; 29/576 E; 148/171; 148/172; 148/1.5; 372/50
[58] Field of Search ................ 29/569 L, 576 E; 148/171, 172, 175, 1.5; 357/17, 55, 45; 372/46, 47, 48, 50

[56] References Cited

U.S. PATENT DOCUMENTS

| | | | |
|---|---|---|---|
| 3,955,082 | 5/1976 | Dyment | 148/1.5 |
| 4,028,146 | 6/1977 | Logan et al. | 148/171 |
| 4,136,928 | 1/1979 | Logan et al. | 29/569 L |
| 4,318,058 | 3/1982 | Mito et al. | 357/17 |
| 4,426,704 | 1/1984 | Nagai et al. | 372/50 |
| 4,445,218 | 4/1984 | Coldren | 372/44 |
| 4,476,563 | 10/1984 | Van Ruyven | 372/47 |

OTHER PUBLICATIONS

Iga et al., "C.W. Operation of GaInAsP/InP Laser with Chemically Etched Mirror", Elect. Lett., vol. 16, No. 22, Oct. 1980.
Waller et al., "Laser Phased Arrays Shine from a Chip", Electronics, vol. 54, No. 21, Oct. 1981.
Nagai et al., "InGaAsP/InP Dual-Wavelength BH Laser", Jap. J. of Appl. Physic, vol. 21, No. 3, Mar. 1982.

Primary Examiner—Brian E. Hearn
Assistant Examiner—Hunter L. Auyang
Attorney, Agent, or Firm—Pearne, Gordon, Sessions, McCoy, Granger & Tilberry

[57] ABSTRACT

Process for producing a laser having several wavelengths, wherein:

a first double heterostructure is produced by epitaxy with an active layer having a first composition, the first double heterostructure obtained is etched into the substrate, through a mask having openings in the form of strips, which leads to a substrate on which there are strips of the first double heterostructure separated by etched portions, a second double heterostructure with an active layer having a second composition is grown in the etched portions, a groove is formed between the first and second heterostructures down to the contact layer, and the groove undergoes proton bombardment.

The invention also relates to the laser obtained by this process.

Application to optical telecommunications.

4 Claims, 5 Drawing Figures

PROCESS FOR PRODUCING A SEMICONDUCTOR LASER WITH SEVERAL INDEPENDENT WAVELENGTHS AND LASER OBTAINED BY THIS PROCESS

BACKGROUND OF THE INVENTION

The present invention relates to a process for producing a semiconductor laser having several independent wavelengths and to a laser obtained by this process. Its application is in the field of optical telecommunications.

The technical field of the invention is that of so-called double heterostructure semiconductor lasers having a junction in the form of a tape or ribbon. A double heterostructure is constituted by a stack of semiconductor layers deposited on a monocrystalline substrate. Starting from the substrate, there is generally a confinement layer, an active layer, a second confinement layer and a contact layer, covered by a metal coating.

For lasers emitting between 0.8 and 0.9 μm, these layers are made from the alloy $Ga_{1-x}Al_xAs$ and the substrate is made from GaAs. For lasers emitting between 1.3 and 1.65 μm, the lasers are formed from $Ga_{1-x}In_xAs_{1-y}P_y$ and the substrate is of InP.

The continuous operation of these lasers is obtained by reducing the active part to a ribbon about 10 microns wide and 300 microns long. This ribbon is obtained by proton bombardment on either side of the area which has to remain active.

The main field in which semiconductor lasers are used is that of optical fibre telecommunications systems. In order to increase the transmission capacity of such systems, wavelength multiplexing is most frequently used. The normally adopted solution consists of connecting lasers emitting at different wavelengths to a single optical fibre, via an optical multiplexer.

The invention aims at providing a process for producing a laser which, itself, is able to emit several wavelengths, in such a way that such a laser can be coupled to the same optical fibre, without a multiplexer.

U.S. Pat. No. 4,318,058, particularly with respect to its FIG. 4, describes a device having several lasers separated by grooves. These lasers have in common a substrate, a confinement layer and an active $Al_xGa_{1-x}As$ layer, in which the proportion x is not the same for the different lasers.

This patent also describes a process for producing such a device. In order to obtain an active layer of varied composition, use is made of a device comprising a mask having a slot, through which molecular epitaxy is performed. This leads to an active layer, whose percentage x can, for example, be continuously increasing.

SUMMARY OF THE INVENTION

The object of the present invention is to provide another process for producing a laser having several wavelengths and which is simpler than the prior art process. Thus, the invention relates to a process, wherein:

a first double heterostructure is produced by epitaxy with an active layer having a first composition, the first double heterostructure obtained is etched into the substrate, through a mask having openings in the form of strips, which leads to a substrate on which there are strips of the first double heterostructure separated by etched portions, a second double heterostructure with an active layer having a second composition is grown in the etched portions, a groove is formed between the first and second heterostructure down to the contact layer, and the groove undergoes proton bombardment.

BRIEF DESCRIPTION OF THE DRAWINGS

The invention is described in greater detail hereinafter relative to non-limitative embodiments and the attached drawings, wherein show.

DETAILED DESCRIPTION OF THE INVENTION

Figure 1:
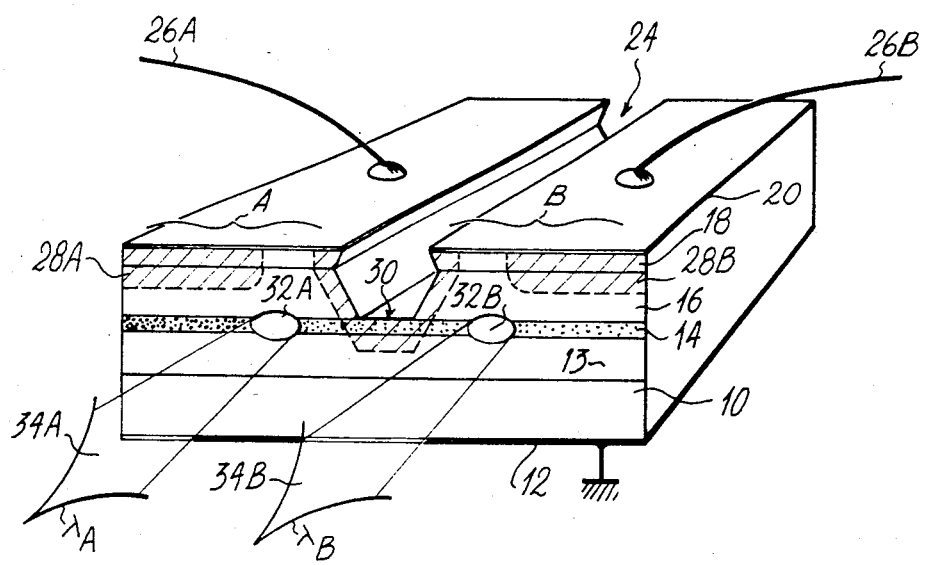
FIG. 1 a laser having several wavelengths.

The laser shown in FIG. 1 comprises a monocrystalline semiconductor substrate 10 under which is deposited a metal coating 12, which is connected to earth and on which there is a first confinement layer 13, an active layer, 14, a second confinement layer 16, a contact layer 18 and finally a metal coating 20.

The composition of the left-hand portion of active layer 14 differs from that of the right-hand portion. Thus, for example, in the case of the left-hand portion it is $(Ga_{1-x}Al_xAs)$, whereas for the right-hand portion it is $(Ga_{1-y}Al_xAs)$, x and y being less than 1 and representing aluminium compositions. For example, we can take $x=0$ to the left (in which case the layer is of GaAs) and $y=0.05$ to the right (which corresponds to $Ga_{0.95}Al_{0.05}As$). Naturally, any other combination is possible.

A groove 24 is formed in the structure, through metal coating 20 and layers 18 and 16 and up to the active layer 14. This defines two independent charge injection areas, respectively A and B. Thus, the laser has two supply connections 26A and 26B, but a single earth contact 12.

The tapes or ribbons defining the active areas of each of the lasers are obtained in conventional manner by increasing the resistivity of the confinement and contact layers by proton bombardment. These are the hatched areas 28A and 28B in FIG. 1. Due to the presence of groove 24, the proton bombardment gives rise, on the edges of said groove, to an insulating region and more particularly, in the active layer, to an area 30, which marks a separation between the two portions of the active layer having different compositions. Finally, the two active channels 32A and 32B respectively emit two radiations 34A, 34B at different and independent wavelengths $\lambda_A$ and $\lambda_B$.

For example, the width of each ribbon can be 10 μm. The groove formed must have a minimum width of 10 μm, e.g. 30 μm. The difference between the wavelengths can be several hundred Angströms. In the case of active layer compositions, such as GaAs and $Ga_{0.95}Al_{0.05}As$, the wavelengths are respectively equal to 0.89 μm and 0.85 μm. The threshold currents of the two lasers are 50 and 60 mA.

The difficulties of introducing two light beams emitted by the laser according to the invention, into a multimode fibre having a core diameter of 50 μm are mainly dependent on the distance separating the two beams. As these two beams emanate from an integrated structure, this distance is very small and approximately corresponds to the width of the groove. In the case of a distance of approximately 10 μm, the coupling losses during this introduction are approximately 3 dB.

Figure 2:
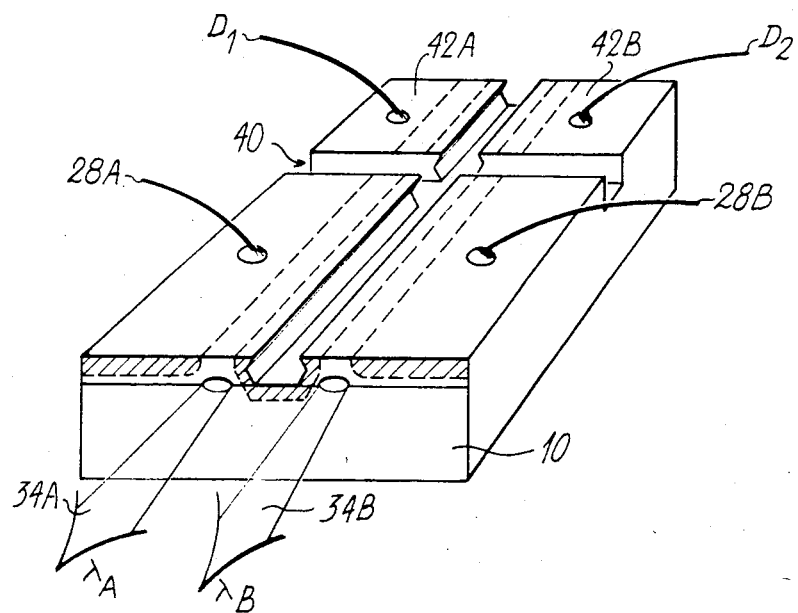
FIG. 2 a laser associated with feedback photodiodes according to the invention.

The use of such a laser in a complete emission module leads to the problem of the choice of the photodetector, which is often associated with the laser in integrated devices (cf. the article by T. P. LEE et al., published in "Electronics Letters", October 1980, p. 845). The use of silicon photodiodes would necessitate the use of optical demultiplexers, which would again make the module more complicated and would increase its cost. According to the invention, preference is given to the integration of the detectors into the structure, as shown in FIG. 2, which shows the aforementioned double laser with two feedback photodiodes.

The laser shown has a groove 40 made in the contact and confinement layers in the vicinity of one of the ends of the double heterostructure and in a direction perpendicular to the two ribbons. This groove is obtained by chemical etching or by ionic machining. Its width is typically approximately 20 microns. This machining defines on one hand, one of the mirrors of the laser (the other being constituted by the front face, which is e.g. a cleaved face) and on the other hand, two diodes 42A and 42B, whereof one, which is reverse-polarized, can serve as the detector.

The quantity of light coupled in the detector is dependent on the width of groove 40. With 20 μm, in the least favourable case (mode with laser having a revolution of symmetry of half-angle 20°), we obtain a coupling coefficient of 20 dB in the detector. Moreover, as the absorption of the active layer at the laser wavelength is approximately 100 cm$^{-1}$, the power detected by a 100 μm long detector is −25 dB compared with the initial power of the emitter, said value being adequate to establish a feedback on the laser.

An example of the process for producing this structure will now be described.

The double composition of the active layer can be obtained by carrying out epitaxy in two stages:

First Stage

Figure 3:
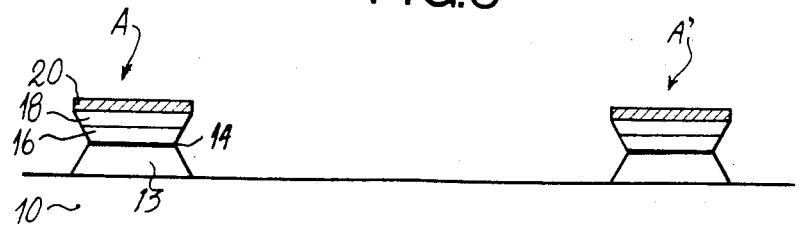
FIG. 3 one of the first stages of the production process according to the invention.

In accordance with conventional processes, a first epitaxy is produced, which leads to a double heterostructure, which is etched in intervals, in order to obtain the structure illustrated in FIG. 3, having, on substrate 10, strips A, A', etc. separated by etched areas, said strips corresponding to a first composition of the active layer.

Second Stage

Figure 4:
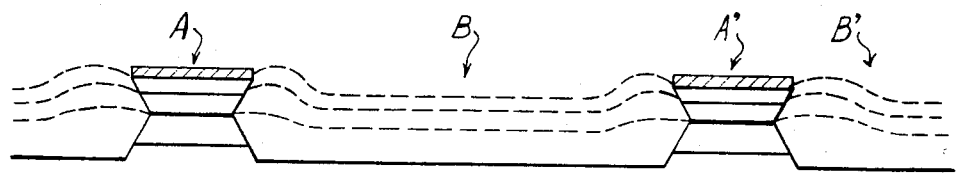
FIG. 4 another stage in the production process according to the invention.

In the thus obtained etched portions, is then grown a second double heterostructure having an active layer differing from that of the first. Areas B, B' are the obtained, which fill the intervals between strips AA', as shown in FIG. 4. It then involves cutting the device to obtain the pairs of double heterostructures AB, A'B', etc.

For the etching of the first double heterostructure, it is possible to use a mask made from silicon nitride ($Si_3N_4$), which has a good masking efficiency at 800° C. and which does not contaminate the epitaxy baths of the second double heterostructure. The "edge effects" after absorbing the epitaxy are reduced by orienting the ribbon defined in the first double heterostructure in direction $<0\bar{1}1>$ and by very slightly etching the substrate.

The following is then a possible sequence of epitaxy operations:

producing the first double heterostructure by liquid epitaxy, marking the orientation $<0\bar{1}1>$, deposition of a $Si_3N_4$ layer, etching the $Si_3N_4$ by a plasma machining device in order to define openings parallel to direction $<0\bar{1}1>$, chemical etching of the first double heterostructure by an acid solution of $H_2SO_4$, $H_2O_2$ and $H_2O$ in a ratio 1:8:1 at 2° C. through the mask, chemical etching of the substrate of the first double heterostructure by ammoniacal acid at 60° C., rinsing with methanol, epitaxy of the second double heterostructure in the etched areas, etching the nitride mask using the plasma machining device and etching with hydrofluoric acid.

Figure 5:
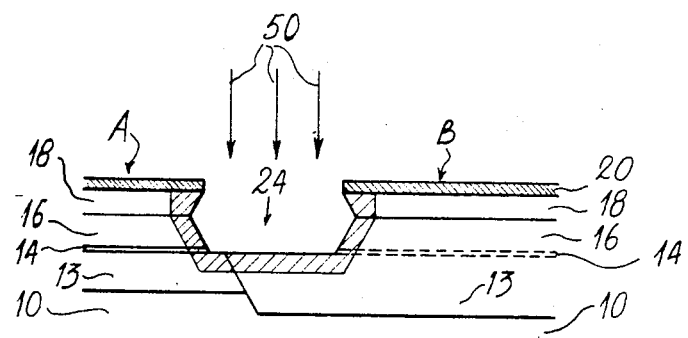
FIG. 5 a detail of the laser in the vicinity of the groove formed.

When these operations have been carried out, it is then necessary to carry out the insulation between the two lasers. For this purpose, a groove 24 is firstly produced by chemical etching using an acid solution of $H_2SO_4$, $H_2O_2$ and $H_2O$ in the proportions 1:8:1 at 2° C., between the two double heterostructures A and B. The metal coating 20 (generally Ti—Au) of the type p contact layers is firstly etched and serves as a mask for the chemical etching process. The appearance of the laser in the vicinity of the groove is shown in section in FIG. 5.

Proton bombardment (200 keV, $10^{15}$ cm$^{-2}$) symbolized by arrows 50 is then carried out, in order to improve the electrical insulation between the two confinement areas and in order to optically insulate the two lasers.

The mask used for the chemical etching of the mirrors is also the Ti—Au of coating 20, and the etching solution is the same as indicated hereinbefore.

What is claimed is:

1. A process for producing a laser emitting two wavelengths, comprising the steps of:

providing a semiconductor substrate;

producing on said substrate by epitaxy a first double heterostructure comprising a first confinement layer, a first active layer having a first composition, a second confinement layer, a first contact layer and a first upper metal coating;

etching said first double heterostructure up to said substrate through a mask having openings in the form of strips, this etching operation leading to strips of said double heterostructure, said strips being separated by etched portions;

producing on said substrate in the said etched portions a second double heterostructure with a third confinement layer, a second active layer having a second composition different from the first, a fourth confinement layer, a second contact layer and a second upper metal coating, said layers of said first double heterostructure and said layers of said second double heterostructure having the same height with respect to said substrate;

carrying out a first etching of a first groove between a strip of said first heterostructure and said second double heterostructure, said groove being etched up to said first and second active layers; and undergoing a proton bombardment into said first groove.

2. A process according to claim 1, wherein the etching operation of said first double heterostructure comprises the step of etching said first upper metal coating and etching the said first double heterostructure through the thus etched first upper metal coating.

3. A process according to claim 1, wherein said first double heterostructure has a $<0\bar{1}1>$ orientation, the etching operation of said first double heterostructure being carried out through a mask having openings parallel to said orientation.

4. A process according to claim 1, wherein a second etching operation is carried out through said first and second double heterostructure up to said first and third confinement layers, said second etching providing a second groove perpendicular to said first groove and providing a mirror for the lasers.

* * * * *